July 24, 1962 W. T. MATZEN ETAL 3,046,487
DIFFERENTIAL TRANSISTOR AMPLIFIER
Filed March 21, 1958
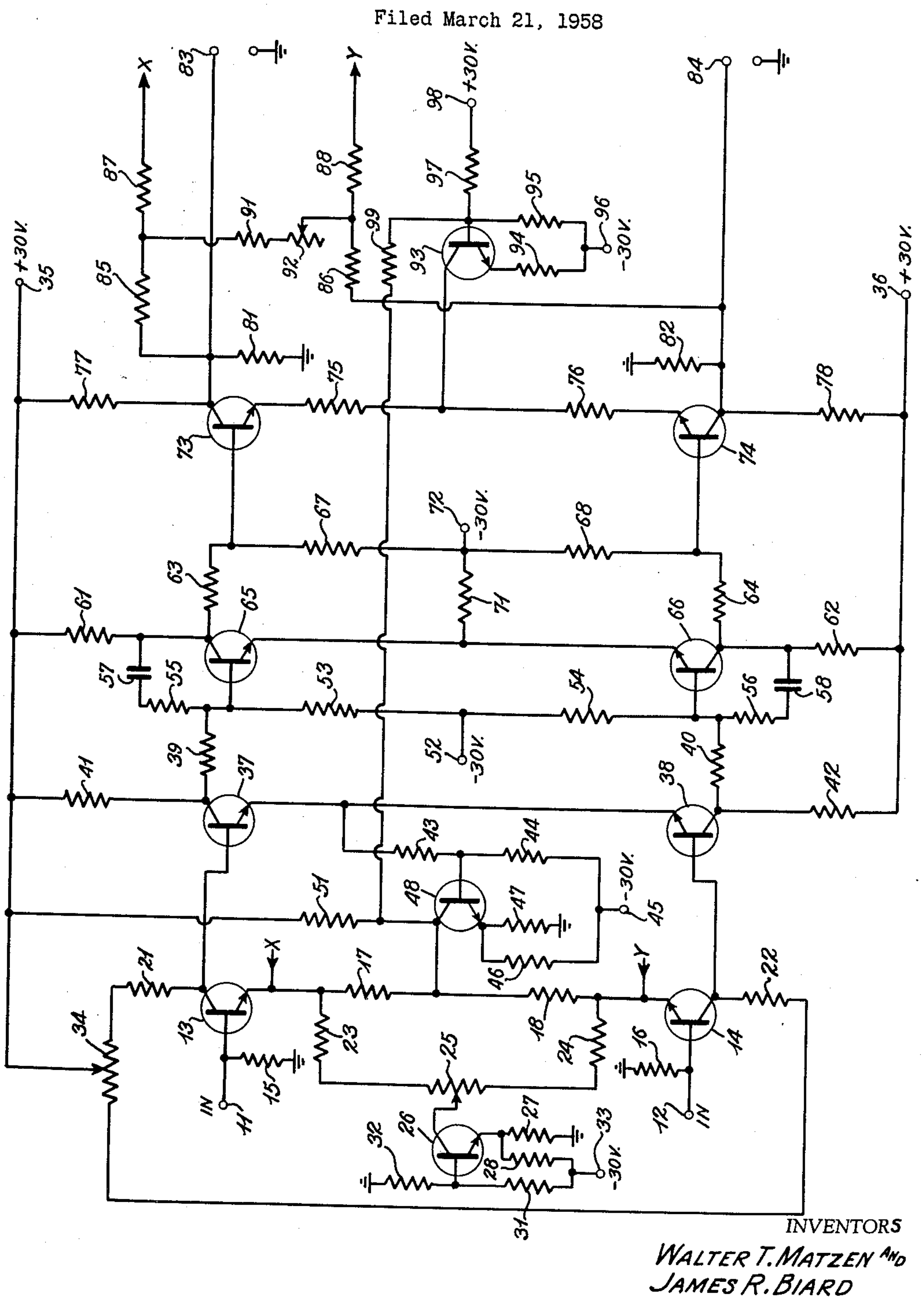
INVENTORS
WALTER T. MATZEN AND
JAMES R. BIARD
BY Stevens, Davis, Miller & Mosher
ATTORNEYS 3,046,487

DIFFERENTIAL TRANSISTOR AMPLIFIER

Walter T. Matzen and James R. Biard, Dallas, Tex., assignors to Texas Instruments Incorporated, Dallas, Tex., a corporation of Delaware Filed Mar. 21, 1958, Ser. No. 722,911
5 Claims. (Cl. 330—19)

This invention relates to a differential direct-coupled D.C. amplifier suitable for amplifying extremely low level, direct voltage signals. More particularly, the invention relates to amplifying means capable of handling low level, direct voltage signals such as those obtained from a transducer of a typical telemetering system and to means for minimizing drift in the D.C. level of such signals which tends to be introduced by the amplifying means.

In selecting a suitable design for a D.C. amplifier circuit there are, of course, a number of requirements which must be met in order to assure satisfactory performance. One of the most critical requirements is drift tolerance. The major sources of drift in a transistorized D.C. amplifier are shifts of the transistor parameters $V_{be}$, $\alpha$, and $I_{co}$ with time or temperature. The effects of shifts in such parameters are especially critical in the input stage of the amplifier.

Whereas various circuits have been proposed in the past to serve as D.C. amplifiers and whereas each possesses certain advantages and features, nevertheless, there has remained substantial room for improvement, particularly as regards drift characteristics. Consequently, a circuit characterized by minimum drift has been continually sought after in this art.

Accordingly, it is a principal object of the present invention to provide a novel and unique design for a D.C. amplifier circuit that will be able to amplify extremely low level D.C. signals and yet will meet stringent drift specifications, will have improved linearity, and will have the required frequency response.

It is a still further object of the invention to provide an improved transistorized differential D.C. amplifier circuit for amplifying low level D.C. signal voltages that includes means to compensate for differential thermal drifts and also means to reject the common level in the input stage and in the output stage.

Other objects and advantages of the invention will become apparent as the following discussion unfolds.

The objects of the invention are accomplished by providing an amplifier means consisting essentially of four differential direct-coupled stages with a high-impedance differential or single-ended input and a low impedance balanced output or single-ended output from either of two terminals. The arrangement will amplify extremely low-level, direct voltage signals from a source of comparatively low D.C. resistance. Drift is minimized in the circuitry by common mode rejection and thermal compensation. The common mode rejection maintains the average output voltage of two output terminals at a fixed value, such as zero, regardless of the voltage level average, within limits, at the two input terminals. The common mode rejection also serves to minimize common level thermal drift and helps maintain the average output voltage at a fixed value, such as zero, over a wide range of temperatures. The circuit employs additional circuitry to compensate for differential thermal drift. Differential thermal drift is what occurs when one of the output terminals becomes more positive than the other with a change of temperature.

The differential connection is used throughout the amplifier since thermal drifts in this configuration are subtractive. Temperature effects are further reduced by selection of the transistors of the first stage for low $I_{co}$ because changes in $I_{co}$ cause drift and this drift is most critical in the first stage. Likewise, the transistor pair of the first stage are matched for changes in $V_{be}$ with temperature.

To maintain minimum drift the base and emitter resistors have low resistances. A special arrangement is then provided to feed back a portion of the output voltage to obtain high input impedance in spite of the low resistance in the emitter and base circuits of the first stage. This feedback is negative and serves to make gain in the amplifier essentially independent of the transistor parameters, to improve linearity, and to provide an improved frequency response.

Common mode rejection is generally known in the prior art for use in differential amplifiers but the prior systems are unsatisfactory for use in transistorized amplifiers of the type of this invention because of the problems associated with providing series feedback in conjunction with low collector currents. The present amplifier, however, operates at extremely low collector currents in the input stage, employs series feedback to obtain high input impedance and yet the circuit is able to reject common level input variations of 5 volts. Similarly, common mode rejections are utilized in the output stage to provide a single-ended output independent of thermal drifts within the amplifier.

Temperature compensation circuits for transistor amplifiers are generally known in the prior art. None of the prior art systems, however, provide a stable method for exact compensation of differential drift in direct-coupled applications. The elegance and operational characteristics achieved by the circuit of the present invention can be demonstrated by the fact that the present amplifier circuit has an input impedance of greater than 100,000 ohms, a linearity of plus or minus 0.5%, a drift voltage referred to the input of less than 25 microvolts per degree centigrade in an hour, a voltage gain from 100 to 500 continuously variable, a frequency response which is flat within 1% to 1000 cycles per second, and a single-ended output impedance of less than 1000 ohms. The output voltage is not affected by common level input changes of 5 volts.

The amplifier circuit comprises 11 transistors including four differential pairs for four stages of amplification and three additional transistors which perform the functions of common mode rejection and temperature compensation.

The objects and advantages of the present invention can be better understood with reference to the drawing.

The single FIGURE of the drawing shows a circuit diagram of the amplifier according to the invention.

In the circuit diagram shown in the drawing the two inputs, the difference of which is to be amplified, are applied to a pair of terminals 11 and 12 connected, respectively, to the bases of a pair of NPN transistors 13 and 14, comprising the first stage of the amplifier. The bases of the transistors 13 and 14 are connected to ground by 75 kilohm resistors 15 and 16, respectively. The emitters of the transistors 13 and 14 are connected together by a series circuit consisting of 500 ohm resistors 17 and 18. Connected in parallel with the resistors 17 and 18 is a second series circuit comprising 2.2 kilohm resistors 23 and 24 connected together by means of a 1 kilohm potentiometer 25. The mid-tap of the potentiometer 25 is connected to the collector of an NPN transistor 26. The emitter of the transistor 26 is connected to ground by means of a 1 kilohm silicon resistor 27, the resistance of which varies substantially with temperature. The resistor 27 has a positive temperature coefficient. The emitter of the transistor 26 is also connected over a 13 kilohm resistor 28 to a D.C. supply of minus 30 volts applied to a terminal 33. The base of the transistor 26 is connected to ground by means of a 3.3 kilohm resistor 32 and to the terminal 33 by means of a 62 kilohm resistor 31. The transistor 26 together with the silicon resistor 27 and connecting circuitry provide a temperature compensation for thermal drift of the amplifier circuit. The compensation for drift can be adjusted by means of the movable contact on the potentiometer 25.

A D.C. supply of plus 30 volts is applied to a terminal 35 which in turn is connected to the midtap of a 250 kilohm potentiometer 34. One end terminal of the potentiometer 34 is connected to the collector of the transistor 13 by means of a 300 kilohm resistor 21 and the other end terminal of the potentiometer 34 is connected to the collector of the transistor 14 by means of a 300 kilohm resistor 22. The first stage transistors 13 and 14 produce between their respective collectors a signal which is the amplified difference between the signals applied at their respective bases from terminals 11 and 12.

The collector of the transistor 13 is connected to the base of an NPN transistor 37 and the collector of the transistor 14 is connected to the base of an NPN transistor 38 to apply the amplified signal from the first stage between the bases of transistors 37 and 38. The transistors 37 and 38 comprise the second stage of the amplifier. The emitters of the transistors 37 and 38 are connected together and are connected to the base of an NPN transistor 48 by means of a 20 kilohm resistor 43. A 68 kilohm resistor 44 connects the base of the transistor 48 to a D.C. supply of minus 30 volts applied to a terminal 45. A 12 kilohm resistor 46 connects the emitter of the transistor 48 to the minus 30 volts at terminal 45 and a 1 kilohm resistor 47 connects the emitter of the transistor 48 to ground. The collector of the transistor 48 is connected to the plus 30 volts at terminal 35 by means of a 25 kilohm resistor 51. The collector of the transistor 48 is also connected to the junction between the resistors 17 and 18. The transistor 48 provides a feedback of signal from the emitters of the second stage transistors 37 and 38 to the emitters of the first stage transistors 13 and 14. This feedback circuit serves to reject the common mode in the input so that the average collector voltage and collector current of the transistors 13 and 14 will be constant regardless of the average voltage input level to terminals 11 and 12.

The collector of the transistor 37 is connected by means of a 33 kilohm resistor 41 to the plus 30 volts applied to terminal 35. A 33 kilohm resistor 42 connects the collector of the transistor 38 to a terminal 36 where a plus 30 volts is also applied. The transistors 37 and 38 produce a signal between their respective collectors which is amplified from the difference signal applied between their respective bases. The collectors of the transistors 37 and 38 are connected by means of a pair of 33 kilohm D.C. dropping resistors 39 and 40 to the bases of a pair of NPN transistors 65 and 66 to apply the amplified signal from the second stage output between the bases of the transistors 65 and 66.

The bases of the transistors 65 and 66 are each connected to a D.C. supply voltage of minus 30 volts applied at terminal 52 by means of a pair of 68 kilohm resistors 53 and 54 respectively. The current flowing through resistors 41, 39 and 53 provides a voltage drop across resistor 39 which provides the correct D.C. level at the base of transistor 65 and resistors 42, 40 and 54 perform a similar function for transistor 66. The emitters of the transistors 65 and 66 are connected together and to a minus 30 volt supply at terminal 72 over a 24 kilohm resistor 71. The collector of the transistor 65 is connected to the plus 30 volts at terminal 35 by means of an 18 kilohm resistor 61 and 18 kilohm resistor 62 connects the collector of the transistor 66 to the plus 30 volts at terminal 36. A series circuit comprising a 470 ohm resistor 55 and an 1100 micro-microfarad capacitor 57 connects the base of transistor 65 to its collector, and likewise a series circuit of a 470 ohm resistor 56 and an 1100 micro-microfarad capacitor 58 connects the base of the transistor 66 to the collector thereof. These RC networks provide frequency shaping necessary to prevent high frequency oscillations under closed loop conditions. The transistors 65 and 66 produce an output signal between their respective collectors which is amplified from the signal applied between their bases. The collector of the transistor 65 is connected to the base of an NPN transistor 73 through a 4.7 kilohm resistor 63, and the collector of the transistor 66 is connected to the base of an NPN transistor 74 through a 4.7 kilohm resistor 64, thus applying the output signal from the third stage, produced at the collectors of transistors 65 and 66, between the bases of the transistors 73 and 14.

The bases of the transistors 73 and 74 are connected to the minus 30 volts at terminal 72 by means of 27 kilohm resistors 67 and 68, respectively. Resistors 61, 63 and 67 provide D.C. level adjustment for transistor 73, and resistors 62, 64 and 68 provide the proper D.C. level for transistor 74. Transistors 73 and 74 comprise a fourth and final stage of the amplifier. A series circuit of 100 ohm resistors 75 and 76 connects the emitters of transistors 73 and 74 together. An 8.2 kilohm resistor 77 connects the collector of transistor 73 to the plus 30 volts at terminal 35, and 8.2 kilohm resistor 78 connects the collector of transistor 74 to the plus 30 volts at terminal 36. A pair of 2.4 kilohm resistors 81 and 82 connect the collectors of transistors 73 and 74, respectively, to ground. The purpose of these resistors is to decrease the single-ended incremental output impedance at each collector, and reduce the effective D.C. supply at the collectors, thus minimizing drift due to variations of the D.C. supply.

The junction of the resistors 75 and 76 is connected to the collector of an NPN transistor 93. The emitter of the transistor 93 is connected by means of a 4.7 kilohm resistor 94 to a minus 30 volts D.C. supply applied at a terminal 96. The base of transistor 93 is connected to terminal 96 by means of a 6.8 kilohm resistor 95 and to a plus 30 volts applied at a terminal 98 by means of a 12 kilohm resistor 97. The transistor 93, together with its connecting circuitry, is a constant current source for the emitters of transistors 73 and 74. It serves to maintain the average collector current and collector voltage of transistors 73 and 74 constant, and thereby maintains an output which is independent of common level thermal drift within the amplifier. Also, a resistor 99 connects the base of the transistor 93 to the collector of transistor 48. The purpose of this connection is to compensate the output stage for effects caused by the common level changes in the emitter potentials of the input stage.

The signal difference applied between the bases of the transistors 73 and 74 will be produced in amplified form between the respective collectors of these transistors and applied directly to a pair of output terminals 83 and 84. The collector of the transistors 73 is also connected to an outgoing lead X by the series circuit of resistors 85 and 87. This lead X is a feedback applied to the emitter of the transistor 13 of the first stage, as indicated by the incoming arrow. The collector of the transistor 74 is similarly connected to an outgoing lead Y by means of a series circuit of resistors 86 and 88. The lead Y is connected back to emitter of transistor 14 as indicated by the incoming arrow. The leads X and Y comprise differential negative feedback from the last stage to the first stage of the amplifier. A series circuit comprising a resistor 91 and a potentiometer 92 joins the junction between resistors 85 and 87 to the junction between resistors 86 and 88. By means of the potentiometer 92, the amount of feedback to the first stage can be adjustably changed, and, thus the gain of the entire amplifier can be continuously varied.

In the circuit above described the difference in amplitude between the two signals applied to terminals 11 and 12 will be amplified through each of the four stages and appear between the output terminals 83 and 84. Because of the common mode rejection the average voltage of the two output terminals to ground will remain constant so either terminal may be used with ground to give a single-ended output. The output from terminal 84 will be opposite in sign from the output from terminal 83 in single-ended applications. A very low impedance balanced output may be obtained between the terminals 83 and 84.

The common mode rejection in the input stage of the amplifier is accomplished by means of minor loop feedback from the second stage to the input stage. The emitter potentials of transistors 37 and 38 determine the signal applied to the base of the transistor 48 by means of the potential divider comprising the series circuit of resistors 43 and 44. The collector current of the transistor 48 assumes a value to maintain the total emitter-current, and accordingly the collector current, flowing through transistors 13 and 14 constant so that the average voltage output from the collectors of transistors 13 and 14 remains constant, regardless of the input applied at terminals 11 and 12. For example, if the inputs at both terminals 11 and 12 increase on the average, the emitter potentials of transistors 13 and 14 increase by almost the same amount since the base to emitter potentials are small and almost constant. Therefore, the sum of the emitter currents in transistors 13 and 14 tends to increase and the collector currents tend to increase. As a result, the collector voltages of transistors 13 and 14 would tend to become lower, which would tend to cause a decrease in the emitter current flowing through transistors 37 and 38.

Since the emitter current in transistors 37 and 38 is supplied from terminal 45 through resistors 43 and 44, a decrease in the current in this emitter circuit will cause a drop in the base voltage applied to the transistor 48. This tends to decrease the collector current flowing through the transistor 48 and to decrease the current supplied to the emitters of the transistors 13 and 14. A decrease in emitter current would, of course, cause a decrease in collector current. As a result, the total collector current through transistors 13 and 14, as well as the average collector potential of transistors 13 and 14, remains substantially constant. Any tendency for the total collector current to increase is offset by a correlative tendency of the collector current of the transistor 48 to decrease.

Since the currents in the leads X and Y change with common level changes of potential at the input, and since these changes may be large compared to the collector currents of transistors 13 and 14, it is not sufficient to supply a constant current to the junction of resistors 17 and 18. The system described requires the sum of the collector currents to be constant regardless of the current, within limits, flowing in the leads X and Y. When the common level of the input increases, the resulting rise of potential at the emitters of transistors 13 and 14 tends to increase the sum of the emitter currents in transistors 13 and 14. This tendency, however, is opposed by a decrease of potential at the base of transistor 48. Likewise, if the common level of the input should decrease, the transistor 48 will compensate in the same manner, but in the opposite direction.

The circuit reacts to adjust effectively to cancel out any change and to restore the condition of a substantially constant average collector voltage of the transistors 13 and 14. This condition persists even though there may be different common input levels. In effect, the transistor 48 maintains a constant current in the emitter of transistors 13 and 14. Also, if there is a common level thermal drift in the first or second stages tending in turn to cause the total emitter current from transistors 37 and 38 to change, the transistor 48 will react accordingly, and tend to reduce such a drift.

A second common mode rejection is also used in the output circuit so that there will be no common level output changes due to thermal drift in the amplifier. Forgetting the resistor 99 temporarily, the voltage divider comprising resistors 95 and 97 is intended to apply, approximately, a constant bias voltage to the base of the transistor 93. The total emitter current from transistors 73 and 74 must flow through the transistor 93. The emitter current of transistor 93, and hence the collector current of transistor 93 is dependent upon the resistor 94 and the voltage from the base of transistor 93 to terminal 96. The collector current of transistor 93 is, therefore, almost independent of the collector potential. Thus, the transistor 93 acts as a constant current source or an extremely high incremental impedance and maintains the total emitter current from transistors 73 and 74 substantially constant. Thereby, the total collector current of transistors 73 and 74, and hence the average collector voltage, is maintained substantially constant. Common level output voltage change is thus substantially eliminated over a wide range of temperature variation.

The transistor 93 and its associated circuitry also provide partial compensation for drift due to changes of the positive battery supply. An increase in the positive 30 volts supply at terminals 35 and 36 produces an increase of potential at the output terminals 83 and 84. If the same positive 30 volt supply is applied at terminal 98, an increase in the positive supply increases the potential at the base of transistor 93 which, in tuprn, increases the emitter and collector currents of transistor 93 increasing the emitter and collector currents of transistors 73 and 74. The increase of collector currents in transistors 73 and 74 produces a potential drop in the collector load resistances in such a direction as to decrease the potential of the output terminals 83 and 84, thus reducing the effect of positive supply voltage variations on the single-ended output at terminals 83 or 84.

The feedback connections X and Y apply a signal between the emitters of transistor 13 and 14 which is of proper polarity with respect to the signal difference applied between input terminals 11 and 12 to constitute differential negative series feedback. This negative feedback serves to maintain a high input impedance and makes the characteristics of the amplifier substantially independent of the transistor parameters. This differential negative feedback also serves to make the output impedance low between the two output terminals 83 and 84. Therefore, the single-ended output impedance between either of the terminals 83 or 84 and ground will be approximately equal to the parallel combination of the collector loads of transistors 73 and 74. By varying the amount of differential feedback from the collectors of transistors 73 and 74 to the emitters of transistors 13 and 14, the overall gain of the system can be varied. This variation is accomplished by means of potentiometer 92. By increasing the resistance inserted by the potentiometer between the junction of resistors 85 and 87 and the junction of resistors 86 and 88, the differential negative feedback is increased and the overall gain will be decreased. Likewise, a decrease in the resistance inserted by the potentiometer 92 will decrease the feedback and increase the overall gain. By varying the resistance inserted by the potentiometer, the overall gain can be varied from 100 to 500.

The purpose of the resistor 99 connected between the collector of the common mode rejection transistor 48, in the first stage, and the base of the common mode rejection transistor 93, in the last stage, is to eliminate effects on the output stage due to changes of common level in the emitters of the input stage. A change in the common level input will tend to cause a change in voltage at the emitters of transistors 13 and 14, even though the output voltage at the collectors of transistors 13 and 14 remain substantially constant. This is because the emitter potentials of transistors 13 and 14 will remain almost equal to their respective base potentials with changes of input level. A change in emitter voltage of transistors 13 and 14 will cause a change in current flow through the feedback connections X and Y. A change in the voltage level at the terminal X, for example, will cause a change in the current flow through resistors 87 and 85, and thus a change in current through the output resistance load comprised of the parallel combination of resistors 81 and 77, thereby causing a change in the output voltage. Likewise, a similar change would be caused in the output resistance load comprised of the parallel combination of resistors 82 and 78 due to the feedback connection Y.

The resistor 99, connecting the collector of the transistor 48 to the base of the transistor 93 applies any voltage changes to the base of the transistor 93 to produce changes in the current flowing therethrough, thereby changing the collector currents flowing through transistors 73 and 74 to compensate for changes of common level in the emitters of the input stage. For example, suppose the input level average applied to terminals 11 and 12 increases. The collector voltages of the transistors 13 and 14 will remain substantially constant due to the decrease in the collector current of the transistor 48. However, since the base to emitter voltages of transistors 13 and 14 remain almost constant with changes of input potential, the average value of voltage at the feedback connections X and Y at the emitters of the transistors 13 and 14 will rise. This will cause an average increase in the current flowing through the collector load of transistor 73 consisting of the parallel combination of resistors 77 and 81, and the collector load of transistor 74 consisting of the parallel combination of resistors 78 and 82. This current increase, in turn, will cause a rise in the average output voltage at terminals 83 and 84.

However, the rise in voltage at the collector of the transistor 48 causes a corresponding rise in the voltage in the base voltage of the transistor 93 thereby increasing the current flowing through this transistor and the average emitter current flowing through the transistors 73 and 74. As a result, more current will flow through the collector loads of transistors 73 and 74 in such a direction as to compensate the current due to the common level voltage change at the emitters of transistors 13 and 14. In effect, the collector current of transistors 73 and 74 is changed by the same amount as the current from the feedback leads X and Y such that no change of current flows in the collector loads of transistors 73 and 74 and no change of potential occurs at the output terminals 83 and 84. Thus, the common mode rejection produced by transistors 48 and 93 compensates to reject changes in common level input where the average input varies from zero plus or minus and, in addition, compensates to reject any common level thermal drift of the circuit. The circuit also compensates for any drift in the common output level due to interaction between input and output through the feedback connections X and Y.

In addition to the common level thermal drift, there is a differential thermal drift for which compensation must be made. This compensation is taken care of by the transistor 26 and the silicon resistor 27. The negative 30 volts applied between terminal 33 and ground maintains sufficient current through resistor 28 and the silicon resistor 27 to produce an appreciable voltage change in series with the emitter of transistor 26 when the silicon resistor 27 changes its resistance value with temperature. A change in temperature causes a change in the emitter current of transistor 26 and as a result, the current injected by the transistor 26 into the emitter circuits of transistors 13 and 14 via the potentiometer 25 and the resistors 23 and 24 is varied.

It is necessary to inject this current into the emitter circuits of transistors 13 and 14 with an extremely high impedance device, such as a transistor, since for any finite impedance connected at this point, the current injected would be dependent upon the common voltage level at the emitters of transistors 13 and 14. Thus, as the resistance from the emitter of transistor 13 to the point of injection is made unequal to the resistance from the emitter of transistor 14 to the point of injection by moving the tap on potentiometer 25 to provide for compensation, a change in the common voltage level at the input would change the current injected and thus change the differential voltage between the emitters of transistors 13 and 14 and the differential voltage at the output terminals 83 and 84. The transistor 26 maintains a constant current, with no change in temperature, in a manner similar to the way that transistor 93 maintains a constant current. How this action is carried out by transistor 26 can be understood from the explanation of how transistor 93 maintains a constant current.

If the ambient temperature should increase, the resistance of resistor 27 will increase substantially, thus causing a decrease in the emitter potential of the transistor 26. The current flowing from the collector of this transistor will accordingly increase. Similarly, a decrease in temperature will cause a decrease in the current flowing from the collector of transistor 26. Now, should a change in ambient temperature cause a temperature drift so that a voltage output is produced between terminals 83 and 84 with a zero voltage input, then this can be compensated by adjusting the midtap of the potentiometer 25. The transistor 26, the silicon resistor 27, and their connecting circuitry are in effect a temperature dependent generator inserted between the emitters of transistors 13 and 14.

Since a silicon resistor varies linearly with temperature, it is an ideal device for compensating thermal drift and exact compensation is possible over a sizable range of temperature. Suppose, for example, that with an increase in temperature, the output lead 83 becomes negative with respect to the output lead 84 with a zero voltage input applied between terminals 11 and 12. To compensate for the output lead 83 going negative, the tap of the potentiometer 25 should be placed nearer the emitter of the transistor 13. This adjustment will effect a decrease in the collector potential of the transistor 13 with respect to the collector potential of the transistor 14, because the emitter potential of transistor 13 is decreased and the emitter potential of transistor 14 is increased by the adjustment. To correct this effect, the midtap of the potentiometer 34 must be placed nearer the collector of transistor 13.

Under these conditions the circuit will be compensated for thermal drift. As the temperature increases, the current from the transistor 26 will increase due to the increase in the resistance of the silicon resistor 27. The average collector voltage of transistors 13 and 14 will be held constant by the common mode rejection of transistor 48, but because the midtap of potentiometer 25 is nearer transistor 13, the collector potential of transistor 13 will be decreased with respect to the collector potential of transistor 14. This differential change will be amplified and inverted three times through the remaining three stages and will have a positive effect on the output terminal 83. Hence the tendency for terminal 83 to decrease in potential with temperature with respect to terminal 84 will be compensated. If the potential of terminal 83 increased with temperature with respect to terminal 84, then the potentiometers 25 and 34 would have to be adjusted in the opposite direction. Other types of temperature-sensitive resistors with adequate stability could be used in lieu of the silicon resistor. Where a resistor with a negative temperature coefficient is used, potentiometers 25 and 34 would be adjusted in the reverse direction to that described for use with the silicon resistor.

Selection of operating current for the input stage has considerable effect on the drift of the amplifier. If collector current and voltage are to be held constant in a transistor, as the temperature is varied, a change of base current is required. This change of base current times the total resistance in the emitter and base circuit represents an equivalent voltage drift referred to the input.

The change in base current with temperature, and therefore, the equivalent input drift, decreases with the value of collector current. However, collector current cannot be decreased indefinitely, since the common emitter current transfer ratio decreases appreciably at low values of collector current. Also, the emitter diode resistance $r'_e$ varies inversely with the collector current and the input drift due to the second stage is determined by $r'_e$ plus the external emitter resistance of the first stage. Fifty microamperes was selected as the optimum collector current for the first stage.

A procedure was developed for selecting input transistor pairs to minimize thermal drifts due to $I_{co}$ and $V_{be}$. Changes of $I_{co}$ produce an equivalent input drift voltage. Although the voltages due to $I_{co}$ in the two input transistors are subtractive, it is not practical to match $I_{co}$ since the temperature coefficient of $I_{co}$ is not uniform. For this reason, the input transistors were selected for a low value of $I_{co}$. $V_{be}$ decreases linearly with temperature at a rate of 2.6 millivolts per degree C. for silicon transistors. This coefficient is quite uniform and will stay within 10% for the majority of transistors of a given type. Because of the linearity of this variation it was possible to match transistor pairs within 60 microvolts per degree C. by measuring $V_{be}$ at 25° C. and 85° C. The absolute values of $V_{be}$ for the input pair were also matched, thus reducing the necessary range of the zero level adjustment by potentiometer 34.

Although transistors may be matched quite closely for temperature coefficient of $V_{be}$ this matching procedure accounts for steady state temperature operation only. The transistors have been found to have thermal time constants which differ by a factor of two. In actual operation, the transistors and the silicon resistor should be mounted in a common heat sink with a high thermal capacity. It is desirable to mount the silicon resistor in a transistor can and physically couple it closely to the input transistor pair.

The particular type of components and values of components of the above described circuit are specified for the purposes of presenting a specific embodiment. The sizes and types of impedances used could be varied without departing from the scope of the invention. Transistors have been described as the active components of the circuit but the common mode rejection feature would be applicable to any other non-linear impedance having a control electrode or means to control the value of the non-linear impedance. The drift compensation feature would be applicable to any non-linear impedance having a control electrode or means to control the value of the non-linear impedance which non-linear impedance tended to have its parameters drift with time or temperature. These and other modifications could be made to the circuit of the present invention without departing from the spirit and scope of the invention which is to be limited only as defined in the appended claims.

What is claimed is:

1. In a differential amplifier, first, second and third amplifying devices each having input, output and common electrodes, a voltage source having first and second terminals, the output electrodes of said first and second amplifying devices being connected to said first terminal of said voltage source through separate load impedance means, resistance means connecting the common electrode of said first amplifying device to the common electrode of said second amplifying device, an intermediate point on said resistance means being connected to the second terminal of said voltage source through the output and common electrodes of said third amplifying device, said third amplifying device being biased such that the current from said intermediate point to said second terminal is substantially unrelated to the voltage on said intermediate point, means responsive to the output voltages on the output electrodes of said first and second amplifying devices and adapted to apply a control voltage to the input electrode of said third amplifying device, said control voltage being related to the average of the output voltages on the output electrodes of said first and second amplifying devices and effective to reject any change in such average by changing the magnitude of the current from said intermediate point to said second terminal, and output means having inputs coupled to the output electrodes of said first and second amplifying devices.

2. Apparatus according to claim 1 wherein said output means includes a pair of differential output terminals, and means are included for separately coupling said differential output terminals to the common electrodes of said first and second amplifying devices to provide differential negative feedback.

3. Apparatus according to claim 1 wherein said output means includes fourth, fifth and sixth amplifying devices each haivng input, output and common electrodes, the output electrodes of said first and second amplifying devices being separately coupled to the input electrodes of said fourth and fifth amplifying devices, the output electrodes of said fourth and fifth amplifying devices being connected to said first terminal of said power supply through separate resistance means, a second resistor connected between the common electrodes of said fourth and fifth amplifying devices, an intermediate point on said second resistor being connected to the second terminal of said power supply through the output and common electrodes of said sixth amplifying device, said sixth amplifying device being biased such that the current from the intermediate point on said second resistor to said second terminal is substantially unrelated to the voltage on said intermediate point, means connecting the output electrode of said third amplifying device to the input electrode of said sixth amplifying device, and means separately connecting the output electrodes of said fourth and fifth amplifying devices to the common electrodes of said first and second amplifying devices whereby differential negative feedback is provided.

4. Apparatus according to claim 1 wherein said amplifying devices are transistors and said input, output and common electrodes are the base, emitter and collector, respectively, of said transistors.

5. Apparatus according to claim 4 including a fourth transistor having a base, an emitter and a collector, means coupling the collector of said fourth transistor to the emitters of said first and second transistors, means for biasing the base and emitter of said fourth transistor such that the collector current thereof is substantially unrelated to the collector voltage thereof, said last means including a temperature responsive resistance means having a large temperature coefficient of resistance.

References Cited in the file of this patent

UNITED STATES PATENTS

| | | |
|---|---|---|
| 2,586,804 | Fluke | Feb. 26, 1952 |
| 2,650,332 | Bordewieck | Aug. 25, 1953 |
| 2,761,917 | Aronson | Sept. 4, 1956 |
| 2,780,682 | Klein | Feb. 5, 1957 |
| 2,802,071 | Lin | Aug. 6, 1957 |
| 2,810,071 | Race | Oct. 15, 1957 |
| 2,826,646 | Williams | Mar. 11, 1958 |
| 2,835,748 | Ensink et al. | May 20, 1958 |
| 2,863,008 | Keonjian | Dec. 2, 1958 |
| 2,897,429 | Jochems | July 28, 1959 |
| 2,941,153 | Merrill | June 14, 1960 |

FOREIGN PATENTS

| | | |
|---|---|---|
| 526,970 | Belguim | May 31, 1954 |
| 761,298 | Great Britain | Nov. 14, 1956 |

OTHER REFERENCES

Walley et al.: Text, "Vacuum Tube Amplifiers," Oct. 1, 1948, McGraw-Hill Book Co., Inc., pages 441–451.

Slaughter: "Feedback-Stabilized Transistor Amplifier," Electronics, May 1955, pages 174–175.